(12) United States Patent
Almoney

(10) Patent No.: US 9,130,639 B2
(45) Date of Patent: Sep. 8, 2015

(54) FREQUENCY RESOLVER

(71) Applicant: Lockheed Martin Corporation, Bethesda, MD (US)

(72) Inventor: Bret Almoney, Endicott, NY (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 63 days.

(21) Appl. No.: 14/022,507

(22) Filed: Sep. 10, 2013

(65) Prior Publication Data

US 2015/0072637 A1 Mar. 12, 2015

(51) Int. Cl.
*H04B 1/26* (2006.01)
*H04B 15/00* (2006.01)
*H04B 1/10* (2006.01)

(52) U.S. Cl.
CPC .................................. *H04B 1/1027* (2013.01)

(58) Field of Classification Search
USPC .......................... 455/313, 314, 315, 323, 272
See application file for complete search history.

(56) References Cited

U.S. PATENT DOCUMENTS

| | | | |
|---|---|---|---|
| 5,266,951 A | 11/1993 | Kuegler et al. | |
| 5,467,091 A | 11/1995 | Watkins et al. | |
| 7,889,120 B2 | 2/2011 | Flasza | |
| 8,107,914 B2 | 1/2012 | Firoiu et al. | |
| 8,185,221 B1 | 5/2012 | Stroili et al. | |
| 2003/0151549 A1* | 8/2003 | Solbach | 342/368 |
| 2005/0242954 A1* | 11/2005 | Franklin et al. | 340/572.2 |
| 2010/0267354 A1* | 10/2010 | Mirzaei et al. | 455/307 |

* cited by examiner

*Primary Examiner* — Nguyen Vo
(74) *Attorney, Agent, or Firm* — Reising Ethington P.C.

(57) ABSTRACT

A frequency resolver and a method for using the resolver. The resolver includes an oscillator circuit, a mixer circuit, and a controller circuit. The oscillator circuit is configured to provide at least two oscillated signals. The mixer circuit is coupled to the oscillator circuit and includes a first frequency mixer and a second frequency mixer for mixing an incoming RF transmission with the two oscillated signals. The mixer circuit further is configured to provide a first output signal from the first mixer and a second output signal from the second mixer. The controller circuit is coupled to the mixer circuit and configured to determine whether at least one of the first or second output signals are associated with an upper sideband (USB) frequency or a lower sideband (LSB) frequency of the RF transmission.

20 Claims, 2 Drawing Sheets

FREQUENCY RESOLVER

BACKGROUND

1. Field

This application relates generally to radio frequency signal discrimination.

2. Description of Related Art Including Information Disclosed Under 37 CFR 1.97 and 1.98

The field of electronic communication includes signal processing of parameters such as amplitude and frequency. In some environments, a threat may be detected based on signal discrimination or differentiation. For example, frequency discrimination may be used in electronic warfare (EW) devices or receivers and other electronic support measure (ESM) devices.

SUMMARY

A frequency resolver and a method for using the resolver. The resolver includes an oscillator circuit, a mixer circuit, and a controller circuit. The oscillator circuit is configured to provide at least two oscillated signals. The mixer circuit is coupled to the oscillator circuit and includes a first frequency mixer and a second frequency mixer for mixing an incoming RF transmission with the two oscillated signals. The mixer circuit further is configured to provide a first output signal from the first mixer and a second output signal from the second mixer. The controller circuit is coupled to the mixer circuit and configured to determine whether at least one of the first or second output signals are associated with an upper sideband (USB) frequency or a lower sideband (LSB) frequency of the RF transmission.

In another embodiment, a method is provided of resolving a frequency of a radio frequency (RF) transmission. The method includes the steps of receiving an incoming RF transmission to a plurality of single-stage frequency mixers; down-converting in a first frequency mixer the RF transmission with a first signal from a first signal generator, down-converting in a second frequency mixer the RF transmission with a second signal from a second signal generator, and based on the down-conversion, determining whether at least one frequency is an upper side band (USB) frequency, a lower side band (LSB) frequency, or a spurious frequency.

DRAWING DESCRIPTIONS

DETAILED DESCRIPTION

The following description pertains to an instantaneous resolver or resolving device for receiving and resolving a radio frequency (RF). The resolver may receive antenna input that may at times include an incoming RF transmission. The resolver is capable of determining the RF transmission from any ambient noise, and the resolver may identify an upper sideband (USB) frequency and/or a lower sideband (LSB) frequency of a carrier signal. This information may be further used to determine the attributes or character of the device that transmitted the carrier signal. In at least one embodiment, the resolver may be used on an aircraft or other suitable vehicle for electronic support measures (ESM) and/or electronic warfare (EW). For example, the resolver may be used for surveillance and, based on the identification of one or more USB or LSB frequencies, determine whether received transmission signals are friend or foe—and further, the type of friend or foe (e.g. the type of aircraft transmitting the signal).

While the following description describes an ESM or EW environment, other environments and applications are possible.

Figure 1:
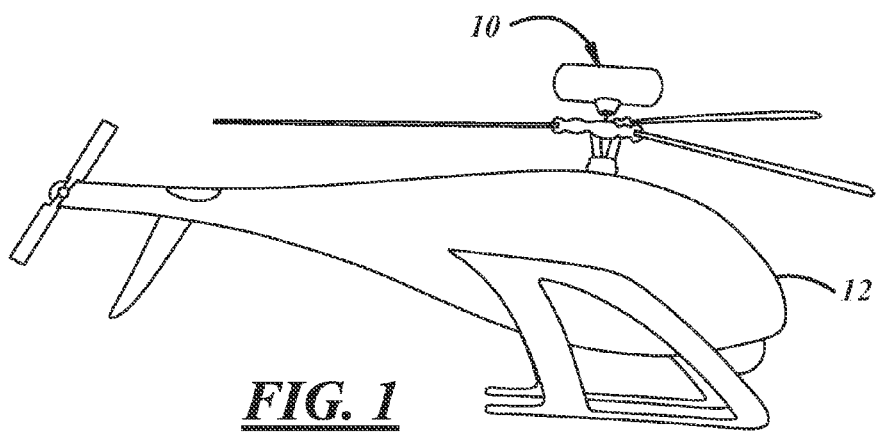
FIG. 1 is a perspective view of a frequency resolving device in an exemplary environment.

FIG. 1 illustrates a resolver or resolving device 10 located on an aircraft 12. More specifically, in this embodiment, the aircraft 12 is an unmanned aerial vehicle (UAV) helicopter; however, this merely an example. The vehicle carrying the resolver 10 may be any vehicle (e.g., capable of traversing land, air, water, etc.) or even non-vehicles, including movable or fixed structures. As will be described in greater detail below, the resolver 10 may be lightweight and have a compact design minimizing its spatial footprint; therefore, it may be particularly adapted to applications in which size and weight requirements are strict. For example, in at least one implementation, the resolver weight may be less than 225 grams and the resolver volume may be less than 640 $cm^3$.

Figure 2:
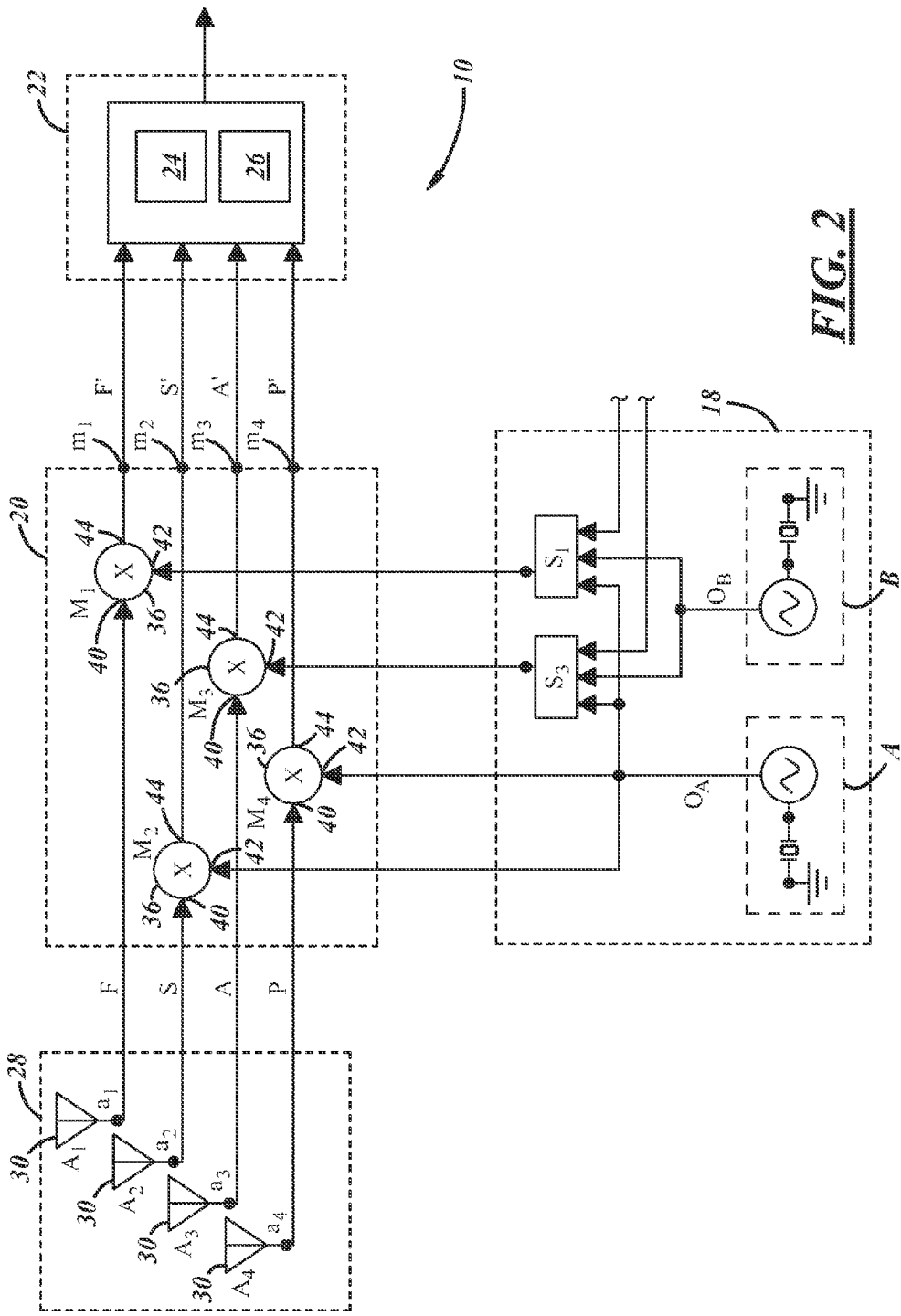
FIG. 2 is a schematic view of one implementation of the resolving device shown in FIG. 1.

FIG. 2 illustrates a schematic view of one embodiment of the resolver 10. The resolver includes an oscillator or waveform-generating circuit 18, a mixer or mixing circuit 20, and a controller circuit 22 that includes at least one processor 24 and memory 26. As shown, both an antenna array 28 and the oscillator circuit 18 feed into the mixer circuit. And the output of the mixer circuit 20 feeds into the controller circuit 22. The antenna array 28 and each of the mixer, oscillator, and controller circuits will be discussed in turn.

The antenna array 28 includes one or more radio or RF antennas 30. The antennas may be configured to receive a wide range of radio frequencies. In at least one example, the range of frequencies receivable by the antennas is between 100-40000 MHz. In FIG. 2, four antennas A1, A2, A3, A4 are illustrated and are coupled to respective channels at their respective outputs a1, a2, a3, a4; however, this is not required. For example, a single antenna may have a single output that is divided into multiple channels (e.g., two, three, four, etc. channels). Or, for example, any number of preselected antennas could be coupled at a single output and a single channel. These are just a few examples of the antenna array 28; others are possible.

In at least one implementation, the antenna array 28 is configured for a vehicle such as the aircraft 12 (e.g., the UAV) and has antennas located in four predetermined locations or proximities; e.g., an aircraft forward or front end location, an aircraft starboard or right side location, an aircraft aft or rear end location, and an aircraft port or left side location. Each of the antennas A1, A2, A3. A4 is coupled to a channel via an output—e.g., a forward channel (F) via output a1, a starboard channel (S) via output a2, an aft channel (A) via output a3, and a port channel (P) via output a4, respectively. Thus, in some implementations, the antenna array 28 may increase the probability of receiving an incoming transmission; and once received, the incoming transmission may be more likely to be resolvable. For example, if noise (e.g., environment, system, vehicle, etc.) distorts the RF transmission at the port antenna of the aircraft, the starboard antenna might receive a less distorted transmission.

In FIG. 2, each of the forward, starboard, aft, and port channels (F, S, A, P) are illustrated as being coupled to one or more frequency mixers 36 of the mixer circuit 20. In the illustrated example, four single-stage mixers 36 are shown (M1, M2, M3, M4). Each frequency mixer is a three-port electronic circuit having two input ports 40, 42 and an output port 44. The input ports of the each mixer 36 may include one RF input port 40 and one local oscillator (LO) input port 42. The RF ports of each of the mixers M1, M2, M3, M4 are shown coupled to the F, S, A, P channels, respectively. In addition, the LO ports of each of the mixers M1, M2, M3, M4 are shown coupled, directly or indirectly, to an oscillator channel $O_A$, an oscillator channel $O_B$, or both, as will be explained in greater detail below. And the frequency mixer output ports 44 (m1, m2, m3, m4) are coupled to channels F', S' A', and P', respectively.

The mixers 36 are illustrated as single-stage mixers; however, this is not required. As used herein, a single-stage mixer is a single mixer for a given channel where F and F' constitute one channel. S and S' constitute another channel, etc. Thus, the single-stage mixer includes one mixer per channel and is coupled between the antenna (e.g. 30) and the controller circuit 22. A single-stage mixer excludes multi-stage mixers where the output port of a first mixer is coupled to an input port of the second mixer, this exclusion applies whether the output port of the first mixer is directly received by the input port of the second mixer (via the channel) or received indirectly (e.g., from output port of the first mixer, through one or more circuit elements (e.g. filters, detectors, amplifiers, etc.), and then into the input port of the second mixer).

Each frequency mixer 36 may be configured to compute the sum and/or difference of two frequency signals (e.g., $f_{IN1}$, $f_{IN2}$) received at ports 40, 42 and to provide an output ($f_{OUT}$) at port 44 (e.g., in an ideal mixer, $f_{OUT}=m*f_{IN1}\pm n*f_{IN2}$, where m and n are integers representing either fundamental or harmonic frequencies). In the implementation shown, the mixers are configured to down-convert (e.g., $|m*f_{IN1}-n*f_{IN2}|$) the frequency received at input port 40 (i.e., the RF frequency) using the frequency received at input port 42 (i.e., the LO frequency).

The oscillator circuit 18 may be tunable and provides at least one frequency to the mixer circuit 20 from at least one oscillator via one or more oscillator channels (e.g., $O_A$, $O_B$). In FIG. 2, two oscillators A, B are shown; in addition, the oscillator circuit 18 includes two switches (S1, S3). Other configurations are possible.

The oscillators A, B may include any suitable signal- or waveform-generator and may include a crystal or any other suitable oscillating device. By way of example and not limitation, the waveforms provided therefrom may be sinusoidal frequencies, square-wave frequencies, saw-tooth frequencies, etc., just to name a few. In at least one configuration, the oscillator A provides a first frequency ($f_A$), and the oscillator B provides a second frequency ($f_B$). Further, in one implementation, the frequencies have different values; i.e., $f_A \neq f_B$. The frequencies of the oscillators A, B may be predetermined and may vary according to the desired application of resolver 10. For example, in some applications, the frequency of either oscillator may be in the range of 1000-39000 MHz. And the difference (N) between the oscillator frequencies may be ±1500 MHz (i.e., $N=|f_A-f_B|\leq 1500$ MHz); however, in at least one implementation, the difference (N) may be ±15 MHz. Thus, for example, oscillator A may provide a 9000 MHz frequency and oscillator B may provide a 9015 MHz frequency.

In one implementation, oscillator B may be suitably configured to calibrate the resolver 10. For example, oscillator B may be configured to calibrate receiver imbalances. Calibration techniques and parameters will be appreciated by those having ordinary skill in the art.

The switches S1, S3 may include any suitable switching devices (e.g., including digital and analog switches). In the present embodiment, the switches are shown as single pole, double throw (SPDT) switches; however, this is merely illustrative. The switches S1, S3 may or may not be jointly actuated, toggled, or triggered; i.e., throwing S1 may or may not simultaneously throw S3, or vice-versa. In the presently illustrated embodiment of FIG. 2, the switches trigger together.

In FIG. 2, oscillator A is directly coupled to the LO ports 42 of M2 and M4 via oscillator channel $O_A$, and is indirectly coupled to the LO ports 42 of M1 and M3 via oscillator channel $O_A$. Similarly, oscillator B is indirectly coupled to the LO ports 42 of M1 and M3 via oscillator channel O.sub.B. For example, switch S1 is coupled in between oscillator A and M1 (and between oscillator B and M1). And for example, switch S3 is coupled in between oscillator A and M3 (and between oscillator B and M3). Thus, depending on the position of switches S1, S3, oscillator A may be coupled to M1 and M3 or oscillator B may be coupled to M1 and M3.

As discussed above, the outputs m1, m2, m3, m4 of the frequency mixers 36 are coupled to channels F', S', A', and P'. Therefore, the mixers 36 may be directly coupled to the controller circuit.

The controller circuit 22 includes at least one processor 24 and the memory 26. The processor 24 can comprise any type of device or devices capable of processing electronic instructions, including microprocessors, microcontrollers, host processors, controllers, communication processors, and application specific integrated circuits (ASICs). The processor 24 can include a dedicated processor used only for the resolver 10 and/or can include a processor shared with other systems (e.g., on the UAV or other suitable vehicle, structure, fixture, etc.). The processor 24 is configured to execute various types of digitally-stored instructions, such as software or firmware programs stored in memory. For instance, the processor 24 can execute programs or process data to carry out at least a part of one of the methods discussed herein.

The method(s) may be performed as one or more computer programs executable by one or more computing devices of or in communication with the resolver 10 to cause the resolver and/or the computing device(s) to perform the method, and the various method related data may be stored in any suitable memory. The computer program may exist in a variety of forms both active and inactive. For example, the computer program can exist as software program(s) comprised of program instructions in source code, object code, executable code or other formats; firmware program(s); or hardware description language (HDL) files. Any of the above can be embodied on a computer usable or readable medium, which include one or more storage devices or articles. Exemplary computer usable storage devices include conventional computer system RAM (random access memory), ROM (read only memory), EPROM (erasable, programmable ROM), EEPROM (electrically erasable, programmable ROM), and magnetic or optical disks or tapes. It is therefore to be understood that the methods may be at least partially performed by any electronic device(s) capable of executing the above-described functions.

The controller circuit 22 may include other parts or components besides the processor 24 and memory; e.g., it may include one or more analog-to-digital (ADC) converters (not shown)—e.g. coupled to each of the F, S', A', and P' channels. And other components also are possible.

Figure 3:
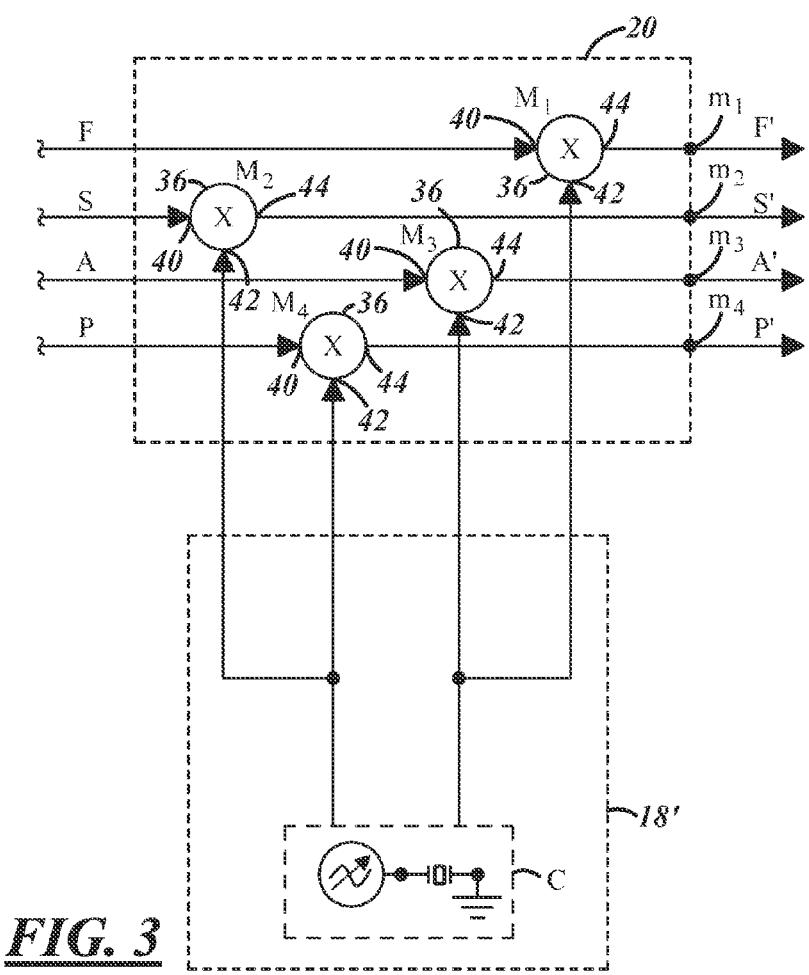
FIG. 3 is a partial schematic view of another implementation of the resolving device.

Now turning to FIG. 3, which illustrates a partial schematic view of an alternative embodiment of the resolver 10 described above, an alternate oscillator circuit 18' is shown, which includes only single oscillator C. However, oscillator C has variable frequency control and thus is configurable to provide one or more frequencies. In one exemplary embodiment, oscillator C provides two frequencies ($f_B$, $f_B$) having a difference (N) where N≤15 MHz (i.e., N=|f$_A$−f$_B$|). Thus, for example, oscillator C may be capable of providing both a 9000 MHz frequency and a 9015 MHz frequency—similar to the two oscillator configuration of FIG. 2. Similarly, at least one of the frequencies provided by oscillator C may be used for calibration as well.

Now turning to one illustrative method of using the resolver 10, the resolver may be used to resolve a RF transmission. Via the antenna array 28, the resolver 10 may receive an RF signal (RF$_{IN}$) composed of an incoming RF transmission (e.g., a target signal) and any other noise. The RF signal may be communicated to the mixer circuit 20 via one or more of the F, S, A, P channels. The RF transmission and/or the noise may include many different RF frequencies (e.g., RF$_{IN1}$, RF$_{IN2}$, ..., RF$_{INi}$, where i is an integer representing the number of frequencies in a given RF signal).

The received RF signal (RF$_{IN}$) may pass to the mixer circuit 20 raw and unaltered by any preprocessing techniques (e.g., no filtering, no saturation detection, no other pre-processing techniques known to skilled artisans, etc.). The RF signal may be received by mixer circuit 20 having any number of frequency mixers 36. However, in at least one embodiment, the mixer circuit 20 has at least two single-stage mixers (M1, M2). Both mixers M1, M2 may receive the RF signal at the RF ports 40 via the F, S channels, respectively.

Mixer M2 may receive at its LO port 42, frequency (f$_A$) from oscillator A via oscillator channel O$_A$. While at suitable times oscillator B may be used during calibration, at other times, oscillator B may be used with the mixer circuit 20 and may provide frequency (f$_B$) to the LO port 42 of mixer M1 via oscillator channel O$_B$. For example, the oscillator B may provide frequency (f$_B$) at least 98% of the time to the mixer circuit 20 while being dedicated to calibration operations approximately 2% of the time. When providing mixer M1 with frequency (f$_B$), switch S1 may be appropriately toggled to enable communication therebetween. Thus, both mixers M1 and M2 may mix the RF signal (RF$_{IN}$) with different frequencies (f$_B$ and f$_A$, respectively).

According to the configuration and arrangement shown in FIG. 2, the mixers M1 and M2 may down-convert the RF signal (RF$_{IN}$) and may each provide one or more intermediate frequencies (IFs) or down-converted signal frequencies at the mixer outputs 44 (m1, m2, respectively). For example, for each frequency of the RF signal (RF$_{IN1}$, RF$_{IN2}$, ..., RF$_{INi}$), there may be one or more intermediate frequencies (IF$_{1.1}$, IF$_{1.2}$, IF$_{1.3}$, IF$_{1.0}$, ...) provided at the output m1 of mixer M1, as will be illustrated below. Similarly, for the same single frequency of the RF signal (RF$_{IN}$), there may be one or more intermediate frequencies (IF$_{2.1}$, IF$_{2.2}$, IF$_{2.3}$, IF$_2$*, ...) provided at the output m2 of mixer M2; and these intermediate frequencies may differ from those at output m1.

During down-conversion, mixer M1 determines the difference between each RF frequency in the RF signal (e.g., RF$_{IN1}$, RF$_{IN2}$, ..., RF$_{INi}$) and frequency f$_B$ from oscillator B to determine the intermediate frequencies (IF). For example, the values of IF may be derived from the expression |m*RF$_{IN1}$−n*f$_B$|. Thus, the quantity of intermediate frequencies will vary depending on the number of frequencies within the RF signal (RF$_{IN}$) and the number of harmonics (e.g., where m and/or n is >1). Thus, in one implementation, the various intermediate frequencies may be represented as IF$_{1.1}$, IF$_{1.2}$, IF$_{1.3}$, IF$_1$*, ....

Mixer M2 may execute a similar process using frequency f$_A$ (instead of frequency f$_B$) to determine intermediate frequencies, which may be represented as IF$_{2.1}$, IF$_{2.2}$, IF$_{2.3}$, IF$_2$*, ....

For purposes of illustration, an example is provided where the RF signal (RF$_{IN}$) includes the following frequencies: RF$_{IN1}$=10,000 MHz, RF$_{IN2}$2=8000 MHz, and RF$_{IN3}$=17,050 MHz; and where the oscillator frequencies are: f$_A$=9000 MHz and f$_B$=9015 MHz. Table I below illustrates the intermediate frequencies IF$_{1.1}$, IF$_{1.2}$, and IF$_{1.3}$ down-converted by mixer M1, and the intermediate frequencies IF$_{2.1}$, IF$_{2.2}$, and IF$_{1.3}$ down-converted by mixer M2. It will be apparent that in determining IF$_{1.1}$, IF$_{1.2}$, IF$_{2.1}$, and IF$_{2.2}$, m and n=1; and in determining IF$_{1.3}$ and IF$_{2.3}$, m=2 and n=1.

TABLE I

| RF$_{IN1}$ = | 10,000 MHz | RF$_{IN2}$ = | 8000 MHz | RF$_{IN3}$ = | 17050 MHz |
|---|---|---|---|---|---|
| IF$_{1.1}$ (f$_B$) | 1000 MHz | IF$_{1.2}$ (f$_B$) | 1000 MHz | IF$_{1.3}$ (f$_B$) | 950 MHz |
| IF$_{2.1}$ (f$_A$) | 985 MHz | IF$_{2.2}$ (f$_A$) | 1015 MHz | IF$_{2.3}$ (f$_A$) | 980 MHz | f$_A$ = 9000 MHz
f$_B$ = 9015 MHz

After down-conversion at mixers M1 and M2, the intermediate frequencies may be communicated to the controller circuit 22, e.g., via channels F' and S', respectively. The controller circuit may determine, based on the values of the intermediate frequencies, whether the frequency from which it was derived (e.g., RF$_{IN1}$, RF$_{IN2}$, ..., RF$_{INi}$) is noise or is associated with the USB or LSB frequency of an RF transmission (e.g., from a friend or foe). In addition, the controller circuit 22 may determine spurious signals that are generated by the down-conversion in the mixers 36.

More specifically, the processor 24 of the controller circuit 22 determines the frequency values of oscillators A and B (f$_A$, f$_B$). These values may be retrieved from memory 26 or may be otherwise retrieved and/or calculated. Thereafter, the processor 24 may determine the difference (N) between these frequencies (N=|f$_A$−f$_B$|). Using the values provided in the example above, N=|9000-9015 MHz|=15 MHz.

In addition, for any given frequency of the RF signal (e.g. RF$_{IN1}$, RF$_{IN2}$, ..., RF$_{IN1}$), the processor 24 determines the difference between the intermediate value determined by mixer M1 and the intermediate value determined by mixer M2 (e.g. for each RF$_{IN1}$, |IF$_{M1}$−IF$_{M2}$|). Using the values provided in the example above to illustrate, the down-conversion of RF$_{IN1}$ (10,000 MHz) by mixer M1 yielded IF$_{1.1}$ or 1000 MHz; and the down-conversion of RF$_{IN1}$ by mixer M2 yielded IF$_{2.1}$ or 985 MHz. Thus, the difference (|IF$_{1.1}$−IF$_{2.1}$|) or |1000 MHz-985 MHz| is 15 MHz. Table II summarizes the intermediate frequency differences for each of the RF signal frequencies (RF$_{IN1}$, RF$_{IN2}$, RF$_{IN3}$) of Table I.

TABLE II

| RF$_{IN1}$ = | 10,000 MHz | RF$_{IN2}$ = | 8000 MHz | RF$_{IN3}$ = | 17050 MHz |
|---|---|---|---|---|---|
| IF$_{1.1}$ − IF$_{2.1}$ | 15 MHz | IF$_{1.2}$ − IF$_{2.2}$ | 15 MHz | IF$_{1.3}$ − IF$_{2.3}$ | 30 MHz |

The processor 24 may compare the value of N to these determined differences, and where the difference is equal to N (N=|f$_A$−f$_B$|), the processor 24 may determine or identify that the associated RF signal frequency as an USB or an LSB frequency. For example, where |f$_A$−f$_B$|=|IF$_{1.1}$−IF$_{2.1}$|, RF$_{IN1}$ is an USB or LSB frequency. As similarly illustrated above, where |f$_A$−f$_B$|=|IF$_{1.2}$−IF$_{2.2}$|, RF$_{IN2}$ is an USB or an LSB frequency.

However, where the difference in the intermediate frequencies is not equal to the difference between f$_A$ and f$_B$, the processor 24 may determine that the associated RF signal frequency is a spurious frequency. For example, since $|f_A-f_B| \neq IF_{1.3}-IF_{2.3}|$, $RF_{IN3}$ is not an USB or LSB frequency. In at least one embodiment, the processor 24 may be configured to ignore and/or reject such spurious signals.

After the processor 24 associates two RF signal frequencies with the USB and LSB frequencies, the processor 24 may then determine which is the USB frequency and which is the LSB frequency. To accomplish this, the processor 24 may determine (or, if necessary, re-determine) the oscillator values ($f_A$, $f_B$). These values may be stored in memory 26 or otherwise retrieved or communicated to the processor 24.

Next, the processor 24 may compare the two intermediate frequency (IF) values down-converted from one of the RF signals associated with either the USB or LSB frequency. For example, referring to the two intermediate frequency values associated with $RF_{IN1}$ (see Table I), the processor 24 may compare $IF_{1.1}$ (down-converted using $f_B$) to $IF_{2.1}$ (down-converted using $f_A$). Where $f_B > f_A$ (as it is in Tables I and II), the USB frequency is identifiable by determining $IF_{1.1}$ ($f_B$)>$IF_{2.1}$ ($f_A$), and the LSB frequency is identifiable by determining $IF_{1.2}$ ($f_B$)<$IF_{2.2}$ ($f_A$). Or where $f_B < f_A$, the USB frequency is identifiable by determining $IF_{1.2}$ ($f_B$)<$IF_{2.2}$ ($f_A$), and the LSB frequency is identifiable by determining $IF_{1.1}$ ($f_B$)>$IF_{2.1}$ ($f_A$).

Thus, by way of example, using the values illustrated in Tables I and II, $RF_{IN1}$ is the USB frequency since 1000 MHz>985 MHz and $RF_{IN2}$ is the LSB frequency since 1000 MHz<1015 MHz.

The response time of the resolver 10 may be virtually instantaneous. As used herein, the term instantaneous implies merely taking the raw incoming RF signal (e.g., received at the antenna 30, passing it through the mixer 36, and making a determination based on that mixed signal at the processor 24. The response time thus may be measured from the time the signal reaches the antenna 30 until the time the processor 24 provides an output or determination. Since the described resolver may be devoid of additional signal processing circuits (e.g. including various buffer circuits, sampling circuits, feedback circuits, etc.), in at least some implementations, the response time may be less than 50 milliseconds. Thus, it will be appreciated that additional response time may be required for additional processing, e.g., sending the processed information to a display or other device, etc.

Additional factors may contribute to the response time of the resolver 10. For example, the resolver may not utilize an a priori emitter database, which typically results in a large identification ambiguity list—particularly when the RF source is agile or exhibits frequency hopping. Thus, the resolver 10 provides a smaller ambiguity list. And a smaller list not only decreases the probability of an incorrect identification, but speeds up the determination time conducted by the processor 24.

As the resolver 10 includes a limited quantity of circuit elements and low-power drawing elements, the resolver's power consumption also is minimized as well.

The operation and use of this resolver 10 has been described with respect to mixers M1 and M2; however, as shown, additional mixers (e.g., M3, M4, etc.) may be used. Additional mixers may provide redundancy; e.g., for verification, validation, or in the event of the failure of one or more of the channels and/or mixers, etc. Where all four mixers M1, M2, M3, M4 are used, switches S and S3 may toggle together such that oscillator A either provides $f_A$ to mixer M1, M2, M3, M4 or such that oscillator A provides $f_A$ to M2 and M4 and oscillator B provides $f_B$ to M1 and M3. Thus, at least in the illustrated implementation, the down-conversions of M1 and M3 may be the same; likewise, the down-conversions of M2 and M4 may also be the same. Of course, this is merely one example, and other arrangements are possible.

The alternate embodiment of FIG. 3 may be operated similarly to that described with respect to FIG. 2. In FIG. 3, the oscillator C of oscillator circuit 18' is capable of providing one or multiple frequencies. Accordingly, in one scenario, oscillator C may provide $f_A$ to mixers M1, M2, M3, and M4. Furthermore, oscillator C may provide some of the mixers one frequency (e.g., $f_A$) and other mixers another frequency (e.g., $f_B$); e.g., mixers M2 and M4 may receive $f_A$ at their respective LO ports 42 and mixers M1 and M3 may receive $f_B$ at their respective LO ports 42. The remainder of the resolver 10 may operate as previously described. Again, in some instances, oscillator circuit 18' may use different quantities of mixers; e.g., only mixers M1 and M2.

In another embodiment, after identifying which RF signal frequencies are associated with the USB and LSB frequencies, the processor 24 may detect, recognize, and/or identify the source of the RF transmission based on the USB and/or LSB frequencies. For example, the processor 24 may determine or detect the source's type or category; e.g., that the source is an aircraft. Or for example, the processor 24 may detect and identify the source with greater specificity—e.g., that the source is an aircraft and, more specifically, that the aircraft is an F-16. In some instances, the detection or recognition may merely be a possible set of sources that are commonly associated with using those USB and/or LSB frequencies.

In yet other embodiments, this detection, recognition, and/or identification may be based on USB and/or LSB frequencies, plus additional data received by the processor 24. In some instances, this determination may not be performed by the processor 24 but by another processing unit (e.g., on board a vehicle carrying the resolver 10 or remotely located therefrom; e.g., where the vehicle transmits or communicates the determined USB/LSB data).

In another embodiment, multiple resolvers 10 may be used. For example, a first resolver may be operative across one predetermined frequency range and a second resolver may be operative across a different, predetermined frequency range. Thus, the first resolver may be used to detect, recognize, and/or identify sources commonly associated with USB and/or LSB frequencies in a first frequency range, and the second resolver may be used similarly to detect, recognize, and/or identify sources commonly associated with USB and/or LSB frequencies in a second frequency range. Of course, additional resolvers may also be used (e.g., a third, fourth, etc.).

One example of a resolver operating within a predetermined frequency range could include a resolver having two oscillators for providing a 9000 MHz and a 9015 MHz frequency, and the operative range could be for identifying a USB frequency between 9896-10423 MHz and a LSB frequency between 7592-8119 MHz.

There has been described a resolver for determining one or more frequencies ($RF_{IN1}$, $RF_{IN2}$, ... ) of an RF signal which may include both an incoming RF transmission and RF noise. The resolver is configured to ignore and/or reject frequencies associated with RF noise and spurious signals resulting from mixing (e.g., from down-converting). The resolver is further configured to identify a USB or LSB frequency of the RF transmission. In at least one embodiment, the frequency(ies) are identified without the use of filters or saturation detection devices. Thus, in this implementation, only the raw RF signal may be passed from the antenna(s) to the mixers M1, M2, M3, M4 and from the mixers to the controller circuit. The absence of these filters and saturation detectors minimizes the size, weight, and power (SWAP) of the resolver—making it more suitable for applications with strict SWAP requirements. In addition, as previously discussed, the resolver may have an dual-purpose oscillator as well; e.g., at least one oscillator signal may be used for calibration applications. Thus, since the oscillator circuit serves a dual-purpose, the overall size and weight of any structure or vehicle carrying the resolver is minimized.

This description, rather than describing limitations of an invention, only illustrates one or more embodiments of the invention recited in the claims. The language of this description is therefore exclusively descriptive and is non-limiting. Obviously, it's possible to modify this invention from what the description teaches. Within the scope of the claims, one may practice the invention other than as described above.

What is claimed is:

1. A radio frequency (RF) resolver, comprising:
   an oscillator circuit configured to provide a first oscillated signal and a second oscillated signal that is different from the first oscillated signal;
   a mixer circuit coupled to the oscillator circuit, the mixer circuit including first and second frequency mixers for mixing an incoming RF transmission, each of the first and second mixers including a first input, a second input, and an output, the first inputs of the first and second mixers being adapted to receive the incoming RF transmission, the second input of the first mixer being adapted to receive the second oscillated signal and the second input of the second mixer being adapted to receive the first oscillated signal, the output of the first mixer being configured to provide a first output signal and the output of the second mixer being configured to provide a second output signal that is different from the first output signal; and
   a controller circuit coupled to the mixer circuit and configured to determine at least one of an upper sideband (USB) frequency or a lower sideband (LSB) frequency of the RF transmission based a characteristic of the first output signal and a characteristic of the second output signal.

2. The RF resolver of claim 1 in which the first and second frequency mixers are configured to down-convert the incoming RF transmission.

3. The RF resolver of claim 1 in which the oscillator circuit has either:
   at least two oscillators, one oscillator providing the first oscillated signal and another oscillator providing the second oscillated signal, or
   a single oscillator providing the first and second oscillated signals.

4. The RF resolver of claim 1 in which the oscillator circuit includes a calibration oscillator configured to provide one of the first or second oscillated signals.

5. The RF resolver of claim 1 in which the oscillator circuit is configured to provide the second oscillated signal ($f_B$) at least 98% of the time that the first oscillated signal ($f_A$) is provided to the mixer circuit.

6. The RF resolver of claim 5 in which the oscillator circuit is configured to provide the first oscillated signal ($f_A$) and the second oscillated signal ($f_B$) at different frequency values, the difference N between the frequency values ($N=|f_A-f_B|$) being less than or equal to 1500 MHz.

7. The RF resolver of claim 1 in which:
   the first output signal includes a first plurality of intermediate frequencies and the second output signal includes a second plurality of intermediate frequencies; and
   the controller circuit is configured to determine the USB frequency or the LSB frequency from the first plurality of intermediate frequencies, and the USB frequency or the LSB frequency from the second plurality of intermediate frequencies.

8. The RF resolver of claim 7 in which the controller circuit is further configured to determine whether the USB or LSB frequency is among the first plurality of intermediate frequencies and whether the USB or LSB frequency is among the second plurality of intermediate frequencies.

9. The RF resolver of claim 8 in which one or more filters or one or more saturation detectors are absent upstream of the controller circuit.

10. The RF resolver of claim 1 in which:
    first and second mixers are single-stage mixers; and
    the mixer circuit further includes a single-stage third mixer and a single-stage fourth mixer; the first, second, third, and fourth mixers each associated with one of a forward channel, an aft channel, a starboard channel, and a port channel, each channel being associated with at least one antenna.

11. The RF resolver of claim 1 in which the weight of the resolver is less than 225 grams and the volume of the resolver is less than 640 cm$^3$.

12. A method of resolving a frequency of a radio frequency (RF) transmission, comprising the steps:
    (a) receiving an incoming RF transmission at a first input of a first frequency mixer and at a first input of a second frequency mixer, receiving a first signal from a first signal generator at a second input of the first mixer, and receiving a second signal from a second signal generator at a second input of the second mixer;
    (b) down-converting the RF transmission at the first mixer using the first signal;
    (c) down-converting the RF transmission at the second mixer using the second signal; and
    (d) based on the down-conversions, determining whether at least one frequency of the RF transmission is an upper side band (USB) frequency, a lower side band (LSB) frequency, or a spurious frequency.

13. The method of claim 12 in which:
    steps (b) and (c) provide a plurality of intermediate frequencies; and
    step (d) further determines which of the intermediate frequencies is the USB frequency and which is the LSB frequency associated with the RF transmission and then ignores the remaining frequencies.

14. The method of claim 12 in which the determined USB or LSB frequencies of step (d) are between 100 and 40000 MHz.

15. The method of claim 12 further includes step (d) identifying the source of the RF transmission based on the determined USB or LSB frequency.

16. The method of claim 12 in which the second signal is a calibration signal within a range of ±1500 MHz of the first signal.

17. The method of claim 12 in which steps (a), (b), (c) and (d) are performed without filtering the RF transmission.

18. The method of claim 12 in which steps (a), (b), (c) and (d) are performed without saturation detection of the RF transmission.

19. The method of claim 12 in which steps (a)-(c) are performed without the operative use of software.

20. The method of claim 12 in which a response time beginning with the receiving step (a) and ending with the determining step (d) is less than 50 milliseconds.

* * * * *

UNITED STATES PATENT AND TRADEMARK OFFICE
CERTIFICATE OF CORRECTION

PATENT NO. : 9,130,639 B2  
APPLICATION NO. : 14/022507  
DATED : September 8, 2015  
INVENTOR(S) : Bret Almoney It is certified that error appears in the above-identified patent and that said Letters Patent is hereby corrected as shown below:

In the Specification

| | | |
|---|---|---|
| In Column 1 | Line 39, | Change "first signal generator," to -- first signal generator; --. |
| | Line 41, | Change "second signal generator," to -- second signal generator; --. |
| In Column 2 | Line 51, | Change ". A4" to -- , A4 --. |
| In Column 3 | Line 10, | Change "S' A'" to -- S', A' --. |
| In Column 4 | Line 10, | Change "O.sub.B" to -- $O_B$ --. |
| | Line 67, | Change "($f_B$, $f_B$)" to -- ($f_A$, $f_B$) --. |
| In Column 5 | Line 47, | Change "$IF_{1.0}$" to -- $IF_{1.*}$ --. |
| | Line 50, | Change "$IF_{2*}$" to -- $IF_{2.*}$ --. |
| | Line 57, | Change "$RF_{IN1}$" to -- $RF_{INi}$ --. |
| | Line 63, | Change "$IF_{1*}$" to -- $IF_{1.*}$ --. |
| | Line 67, | Change "$IF_{2*}$" to -- $IF_{2.*}$ --. |
| In Column 6 | Line 3, | Change "$RF_{IN}2$=8000 MH" to -- $RF_{IN2}$ = 8000 MH --. |
| | Line 7, | Change "$IF_{1.3}$" to -- $IF_{2.3}$ --. |
| | Line 40, | Change "$RF_{IN1}$" to -- $RF_{INi}$ --. |
| | Line 43, | Change "$RF_{IN1}$" to -- $RF_{INi}$ --. |
| In Column 7 | Line 3, | Change "≠$IF_{1.3}$" to -- ≠l $IF_{1.3}$ --. |
| | Line 31, | Change "the antenna 30" to -- the antenna 30) --. |
| | Line 62, | Change "switches S" to -- switches S1 --. |
| In Column 9 | Line 2, | Change "may have an" to -- may have a --. |

In the Claims

| | | |
|---|---|---|
| In Column 9 | Line 37, | Change "based a characteristic" to -- based on a characteristic --. |

Signed and Sealed this  
Third Day of May, 2016

Michelle K. Lee  
*Director of the United States Patent and Trademark Office*